US008664968B2

(12) United States Patent
Baldwin et al.

(10) Patent No.: US 8,664,968 B2
(45) Date of Patent: *Mar. 4, 2014

(54) ON-DIE PARAMETRIC TEST MODULES FOR IN-LINE MONITORING OF CONTEXT DEPENDENT EFFECTS

(75) Inventors: Gregory Charles Baldwin, Plano, TX (US); Thomas J. Aton, Dallas, TX (US); Kayvan Sadra, Addison, TX (US); Oluwamuyiwa Oluwagbemiga Olubuyide, Plano, TX (US); Youn Sung Choi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 407 days.

This patent is subject to a terminal disclaimer.

(21) Appl. No.: 12/890,146

(22) Filed: Sep. 24, 2010

(65) Prior Publication Data

US 2012/0074973 A1    Mar. 29, 2012

(51) Int. Cl.
*G01R 31/3187* (2006.01)

(52) U.S. Cl.
USPC ............................................. 324/750.3

(58) Field of Classification Search
USPC ............................................. 324/750.3
See application file for complete search history.

(56) References Cited

U.S. PATENT DOCUMENTS

| 5,949,090 | A | * | 9/1999 | Iwasa et al. | 257/48 |
|---|---|---|---|---|---|
| 5,970,311 | A | * | 10/1999 | Cheek et al. | 438/11 |
| 5,986,283 | A | * | 11/1999 | Bush et al. | 257/48 |
| 6,770,906 | B2 | * | 8/2004 | Corbett et al. | 257/48 |
| 2003/0062521 | A1 | * | 4/2003 | Jang et al. | 257/48 |
| 2003/0190888 | A1 | * | 10/2003 | Mangal et al. | 455/3.05 |
| 2006/0190888 | A1 | * | 8/2006 | Parthasarathy et al. | 716/8 |
| 2008/0099761 | A1 | * | 5/2008 | Feustel et al. | 257/48 |
| 2008/0237586 | A1 | * | 10/2008 | Sun et al. | 257/48 |
| 2009/0039912 | A1 | | 2/2009 | Bickford et al. | |
| 2009/0058456 | A1 | * | 3/2009 | Okayasu et al. | 324/766 |
| 2009/0212793 | A1 | * | 8/2009 | Guldi et al. | 324/751 |
| 2009/0243645 | A1 | * | 10/2009 | Shinkawata | 324/765 |
| 2010/0122231 | A1 | * | 5/2010 | Agarwal et al. | 716/19 |
| 2010/0258798 | A1 | * | 10/2010 | Sokel et al. | 257/48 |

* cited by examiner

*Primary Examiner* — Jermele M Hollington
*Assistant Examiner* — Demetrius Pretlow
(74) *Attorney, Agent, or Firm* — Warren L. Franz; Wade J. Brady, III; Frederick J. Telecky, Jr.

(57) ABSTRACT

An integrated circuit (IC) die has an on-die parametric test module. A semiconductor substrate has die area, and a functional IC formed on an IC portion of the die area including a plurality of circuit elements configured for performing a circuit function. The on-die parametric test module is formed on the semiconductor substrate in a portion of the die area different from the IC portion. The on-die parametric test module includes a reference layout that provides at least one active reference MOS transistor, wherein the active reference MOS transistor has a reference spacing value for each of a plurality of context dependent effect parameters. A plurality of different variant layouts are included on the on-die parametric test module. Each variant layout provides at least one active variant MOS transistor that provides a variation with respect to the reference spacing value for at least one of the context dependent effect parameters.

16 Claims, 6 Drawing Sheets

# ON-DIE PARAMETRIC TEST MODULES FOR IN-LINE MONITORING OF CONTEXT DEPENDENT EFFECTS

FIELD

Disclosed embodiments relate to semiconductor wafers and integrated circuit (IC) die having on-die parametric (ODP) test modules.

BACKGROUND

This application relates to subject matter that may be similar to application Ser. No. 12/890,123 filed Sep. 24, 2010, the entirety of which is hereby incorporated by reference.

As known in the art, a plurality of production IC die are formed on a semiconductor wafer by performing semiconductor processing including lithography, etch, ion implant and thin film processes. Following formation of the IC die, the wafer is sawed for singulation of the die.

To assess electrical properties of elements (e.g., MOS transistors) constituting an IC die, a predetermined pattern of measuring elements or test elements (called test modules) are formed in the scribe line areas of the wafer to allow generation of in-line (i.e., production) test data. The test module is electrically tested by a test system including a probe card, prober system and measurement apparatus, and testing can be performed after deposition of an early metal interconnect level (e.g., first metal level) or after completion of wafer processing, for determining whether circuit elements such as MOS devices are suitably formed (e.g., have proper threshold voltage (Vt) and breakdown voltage) in the IC die on the wafer. Since the test module is formed using the same process as the process for forming the circuit elements formed on the IC die, and often having the same device layout, testing electrical properties of the devices in the test module can be identical to testing electrical properties of the circuit elements formed in the production IC die. Accordingly, the properties of the IC die can be generally be accurately deduced by testing the test modules.

One problem with scribe line measurements is that scribe lines are not within the actual production die boundary. Accordingly, scribe line measurements can be affected by surrounding devices and may provide measurements that indicate that the corresponding IC design requirements are met, while the actual IC die may not be in compliance. Moreover, scribe lines no longer exist after the wafers are singulated. Thus, if it is determined that there is a problem at the device level, there may be uncertainty as to where the problem originated. Moreover, it may be difficult to determine if the problem was due to a manufacturing error, was a transient problem that no longer exists, or is a problem in the design of the IC die.

Another method to assess electrical properties of elements constituting an IC die uses on-die parametric test modules that are placed on the production IC die. On-die parametric test modules can generally be placed anywhere on the die, since no specific pinout is needed. On-die parametric test modules can be tested at wafer final test, and at module or system test after singulation. Conventional on-die parametric test modules include arrays of MOS field effect transistors (FETs) having some particular device layout or a sampling of small area layout portions (e.g., digital logic gates) that match the device layout used for logic designs on the product IC die, which hold constant the various spacings (e.g., active area-to-active area spacing, and well-to-well spacing) in the device layout for the logic design.

Data processing from on-die parametric test modules comprising arrays of FETs can involve having their collective $I_{on}$ measurements averaged, and recorded, along with threshold voltage (Vt) and effective drive current ($I_{eff}$) measurements, if applicable. This is done to account for spatial variations. Thus placement of a plurality of test modules across each IC die allows across the die parametric variation data to be extracted and analyzed.

SUMMARY

The disclosed embodiments recognize that as higher levels of strain are introduced to MOS technologies to boost transistor performance, and as technology nodes advance to 28 nm and smaller, the layout induced (context dependent) parametric shifts and variations significantly increase as a percentage of the total process induced variation. For example, when the technology is in volume production at multiple manufacturing facilities, a method for monitoring the context variation is needed to ensure good circuit performance and functionality. For MOS transistors, the parameters affected by adjacent layout features generally include effective drive current ($I_{eff}$) and threshold voltage (Vt).

As used herein, "context dependent effects" include at least eight different proximity effects: the well (e.g., p-well or n-well) proximity effect, active area proximity effect (referred to herein as the active proximity effect), dual stress liner (DSL) boundary proximity effect (for stressed designs), STI stress effect (for shallow trench isolation designs), strain engineered stress effect (e.g., SiGe for pMOS source/drain and SiC for nMOS source/drain), length-of-gate oxide definition (LOD) effect, the polysilicon gate (poly) proximity effect, contact proximity effect, non-rectangular active effect, and the active area jog effect.

Most of these context dependent effects cannot be isolated from other context dependent effects using a single layout structure. As a result, to be able isolate all such context dependent effects to allow a monitor that quantifies (i.e., provides a quantifiable relationship between an electrical parameter such as Vt or $I_{eff}$ and a spacing such as LOD for a range of LOD) all of these context dependent effects, at least several hundred different layout structures would be needed.

This large number of different layout structures needed to measure the different types of context effects cannot thus all be individually monitored with the usual method of scribe line test modules without significantly increasing the scribe line area (i.e., width), which would result in substantially fewer die per wafer and thus a substantially increased cost for each chip. Although on-die parametric test modules can occupy more area than scribe line test modules, the large number of different layout structures needed to measure the different types of context dependent effects would generally result in an unacceptably large loss in die area.

By identifying the more significant context dependent effects, including some combined effects, test modules having a small enough number of different layout structures can be configured that enable disclosed on-die parametric test modules to fit on a relatively small area of the IC die (e.g., typically less than 0.05% of the die area), while still being able to monitor a plurality of context dependent effects. Such disclosed on-die parametric test modules provide context effect variation for a plurality of context dependent effects that enables in-line production monitoring and context dependent effect parameter isolation to allow quantification of those context dependent effects found to be most significant in effect.

Disclosed embodiments describe on-die parametric test modules for in-line (i.e., on production wafer) monitoring and quantifying a plurality of context dependent effects in the production of integrated circuits (ICs). In one disclosed embodiment, a semiconductor die includes at least one on-die parametric test module. The die comprises a substrate die area, and a functional IC comprising a plurality of circuit elements configured for performing a circuit function on an IC portion of the die area. The on-die parametric test module is formed in the die area outside the IC portion, typically (but not necessarily) being formed along an edge of the IC die, such as in a corner. The on-die parametric test module comprises a reference layout that includes at least one active reference MOS transistor, wherein the active reference MOS transistor in the reference layout has a reference spacing value for each of a plurality of context dependent effect parameters, and a plurality of different variant layouts. Each variant layout includes at least one active variant MOS transistor that provides a variation with respect to the reference spacing values for at least one of the plurality of context dependent effect parameters.

DETAILED DESCRIPTION

Figure 1:
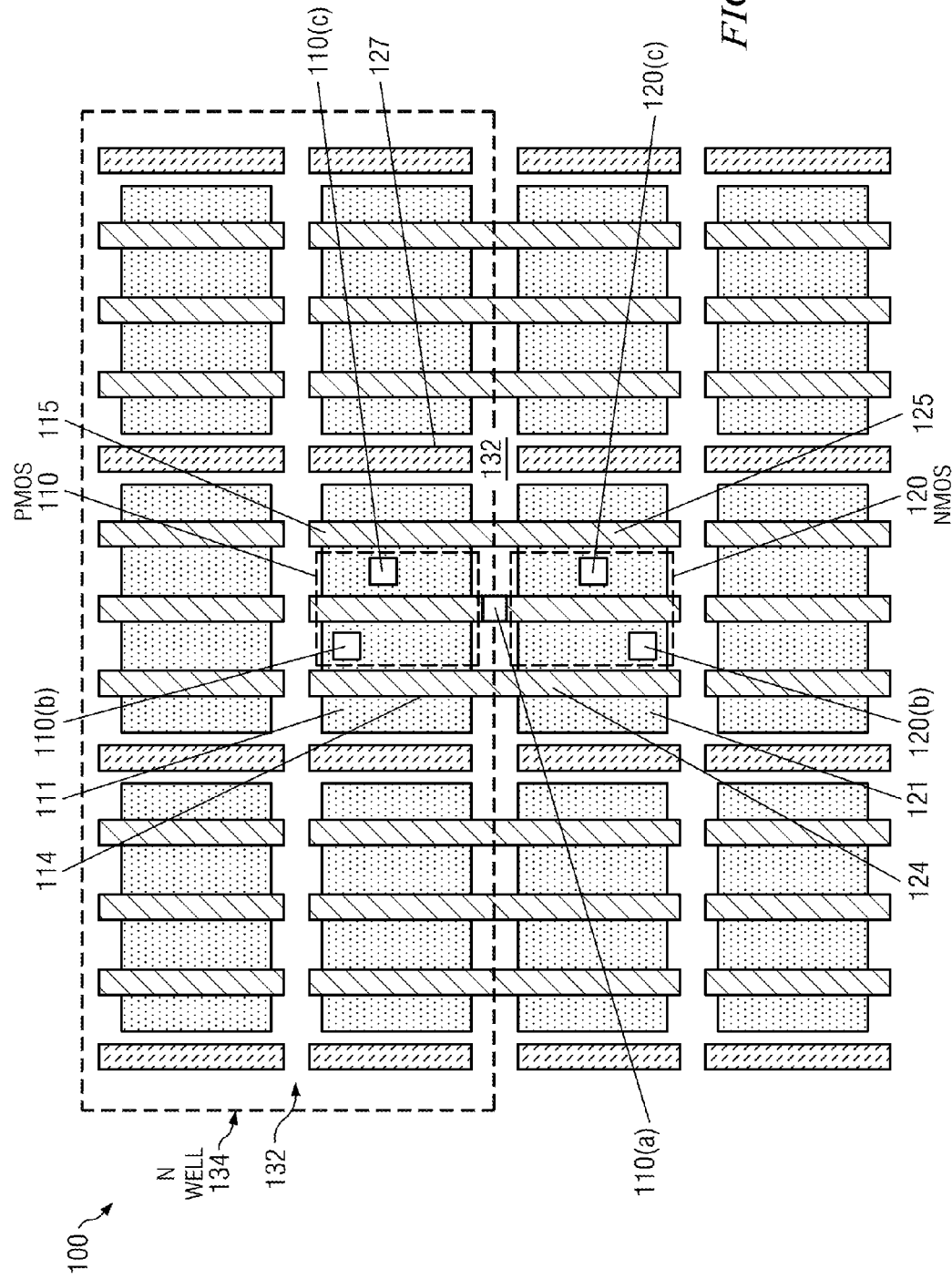
FIG. 1 shows an example reference layout including an active reference pMOS transistor and an active reference nMOS transistor, according to a disclosed embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIGS. 1-5 described below are selected from a set of example layouts included in disclosed on-die parametric test modules that can be used to measure the most significant context dependent effects for ICs, such as, but not limited to, ICs including digital logic circuitry. In a typical embodiment, there are approximately 50 to 300 different layouts for each transistor type (core NMOS, core PMOS, low voltage threshold (LVT) NMOS, etc.), with the layout variations including transistor geometry including gate length (L) and gate width (W), as well as for a plurality of different context dependent effects.

FIG. 1 shows an example standard cell-based reference layout 100, according to an example embodiment. As known in the art and used herein, a "standard cell" layout for a test module has the same standard dimensions and configuration as the corresponding dominant layout used in one or more sets of "standard cells" in the IC die area (e.g., standard IC design cells implementing logic gates such as NAND, NOR, NOT, etc.) on the same die. This includes, for example, gate widths, well configurations, transistor pitches and spacings, and active area widths and spacings typical of such standard cells. Some IC designs use more than one library of standard cells and hence disclosed embodiments may include more than one "standard cell" test module layout.

The example reference layout 100 includes two active transistors comprising an active reference pMOS transistor 110 and an active reference nMOS transistor 120, which will both have their electrical behavior modeled in an IC simulation model (e.g., SPICE model) to provide reference points in the model. All other transistors shown in FIG. 1 are dummy transistors. As used herein "active" transistors in layouts for disclosed on-die parametric test modules have their terminals (gate, source, drain and body) electrically connected to bond pads to permit testing using a probe system including a probe card. In contrast, "dummy" transistors in layouts for disclosed on-die parametric test modules have their terminals floating (electrically unconnected).

Active reference pMOS transistor 110 has a gate that spans an n-doped active area 111 that is defined within an n-doped well region 134 formed in a p-type layer of a wafer substrate, and active reference nMOS transistor 120 has a gate that spans a p-doped active area 121 defined within the wafer substrate p-type layer. The active areas 111, 121 are regions of semiconductor (e.g., silicon) material laterally isolated by surrounding dielectric (e.g., oxide) material from neighboring isolated semiconductor material regions. (The boundary of n-doped well 134 shown in dashed lines underlies the dielectric material.) Reference active pMOS transistor 110 is shown in FIG. 1 with its gate spanning the middle of active area 111, and with two dummy gates 114, 115 (e.g., polysilicon gates) on either side spanning the same active area 111. Similarly, reference active nMOS transistor 120 is shown in FIG. 1 with its gate similarly located in the middle of active area 121, with two dummy gates 124, 125 (e.g., polysilicon gates) on either side over the same active area 121. As noted above, the dummy gates 114, 115, 124, 125 are not electrically connected and are thus left electrically floating.

There are 12 active areas shown in the example layout (two functional active areas 111, 121 and ten dummy non-functional active areas surrounding the two functional active areas 111, 121). All active areas are formed using same or similar processes and parameters, and all are similarly traversed by active and/or dummy gates. The functional and dummy gates are also formed using same or similar process and parameters, with same gate length dimensions (in the transistor channel direction). As shown, the gates over neighboring active areas of different doping type (e.g., active areas 111, 121) are formed as common gates (e.g., the gate of active transistor 110 and adjacent dummy gates 114, 115). Pitch-matched (and gate length matched) field gate lithography assist features 127 are shown in field regions 132 next to the end gates of each active area, including active areas 111 and 121. In one embodiment, the active, dummy and lithography assist feature gates are all polysilicon gates of same gate length or about the same gate length, although other gate electrode materials can also be used.

Appropriately doped transistor source/drain regions are formed adjacent the active and dummy gates in all active regions. One or more conductive metal contacts 110(a), 110(b) and 110(c) respectively electrically contact the gate and p+ source/drain regions of active reference pMOS transistor 110. Similarly, metal contacts 110(a) (common gate with pMOS 110), 120(b) and 120(c) respectively electrically contact the gate and n+ source/drains of active reference nMOS transistor 120. The contacts for active transistors 110 and 120 are electrically connected by patterned interconnect metal leads to probe pads through metal leads and addressing circuitry. The dummy transistor gates, source/drain regions, etc. remain unconnected.

The design parameters for pMOS transistor 110 and nMOS transistor 120 in reference layout 100 (e.g., the gate width and length, and width/length, as well as the various context dependent parameters) are generally selected based on typical pMOS and nMOS transistors formed within the functional IC portion of the die area. For example, active area-to-active area spacing, such as from n-doped active area 111 to p-doped active area 121, can be 0.35 µm. As shown, active reference pMOS transistor 110 and active reference nMOS transistor 120 are located away from the edge of their respective active areas, and each active area 111, 121 has a single pitch-matched field gate assist feature 127 on both of its ends set at a location to provide uniform gate-to-gate spacing of active, dummy and field gates in the gate length (i.e., channel electron or hole flow) direction.

The electrical behavior of active reference MOS transistors 110 and 120 is modeled in an IC simulation model (e.g., SPICE model) to provide a reference point in the model, that can include setting context dependent effect parameter measures associated with its reference spacing values to zero. Reference MOS transistors 110 and 120 can thus be used as a baseline, against which comparisons are made to other MOS transistors. Comparison to a reference (or baseline) device isolates systematic offsets from sources of global variation, in the same way that matching devices in circuitry helps to remove global variation.

Figure 2:
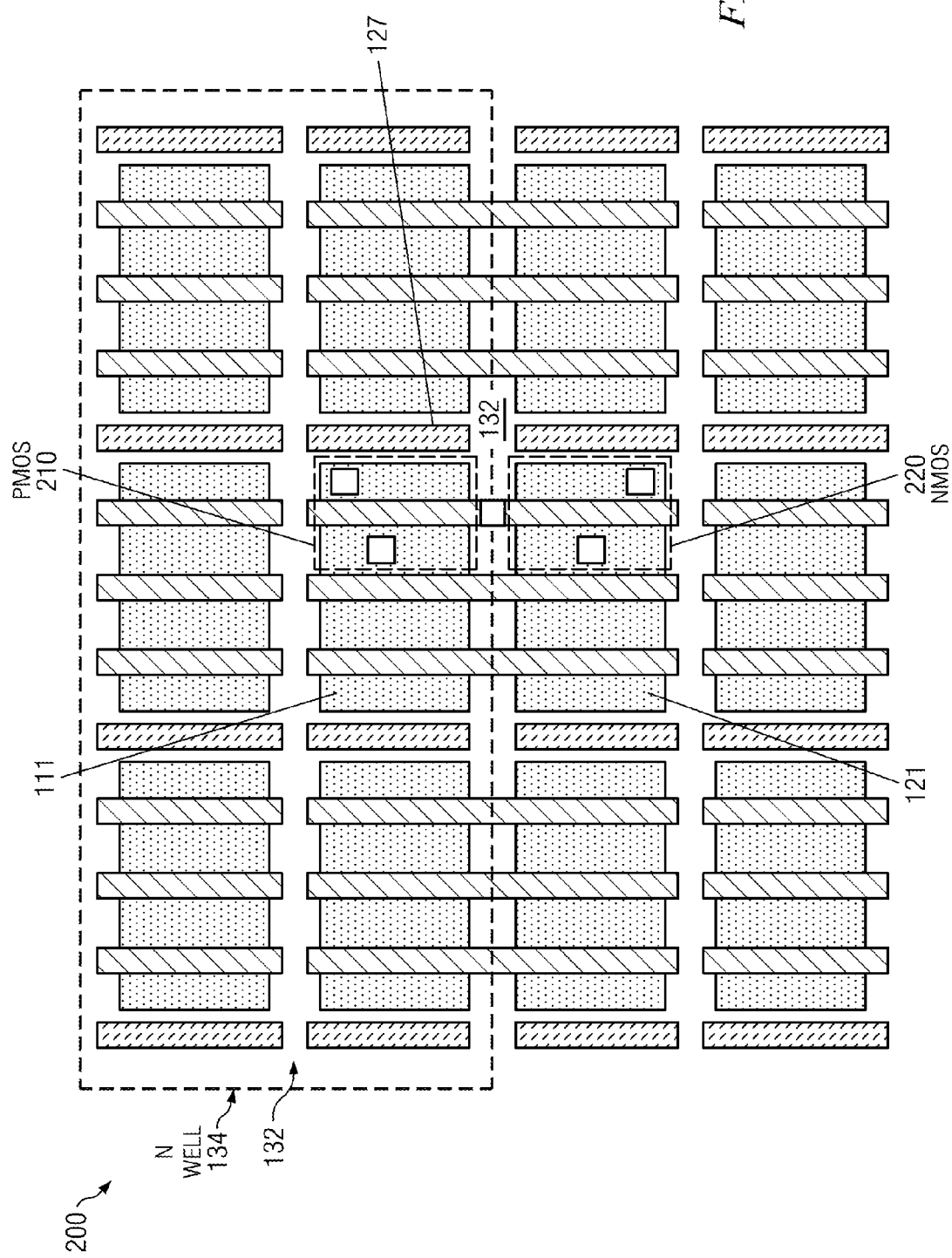
FIG. 2 shows an example variant layout providing context variation for a plurality of context dependent effect parameters shown as the length-of-gate oxide definition (LOD) and last gate context dependent effects, according to a disclosed embodiment.

FIG. 2 shows an example embodiment of a variant layout 200 providing context variation for a plurality (two shown) of context dependent effect parameters, such as, for example, the length-of-gate oxide definition (LOD) and the last gate context effects. The example layout 200 includes two active transistors comprising active variant pMOS transistor 210 and active variant nMOS transistor 220, shown located at the far right edges of the active areas 111 and 121, respectively. Note that other context dependent effects, such as the spacing between active areas, including the spacing between active areas 111 and 121, are the same as for the active reference MOS transistors 110 and 120 shown in layout 100 in FIG. 1.

Figure 3:
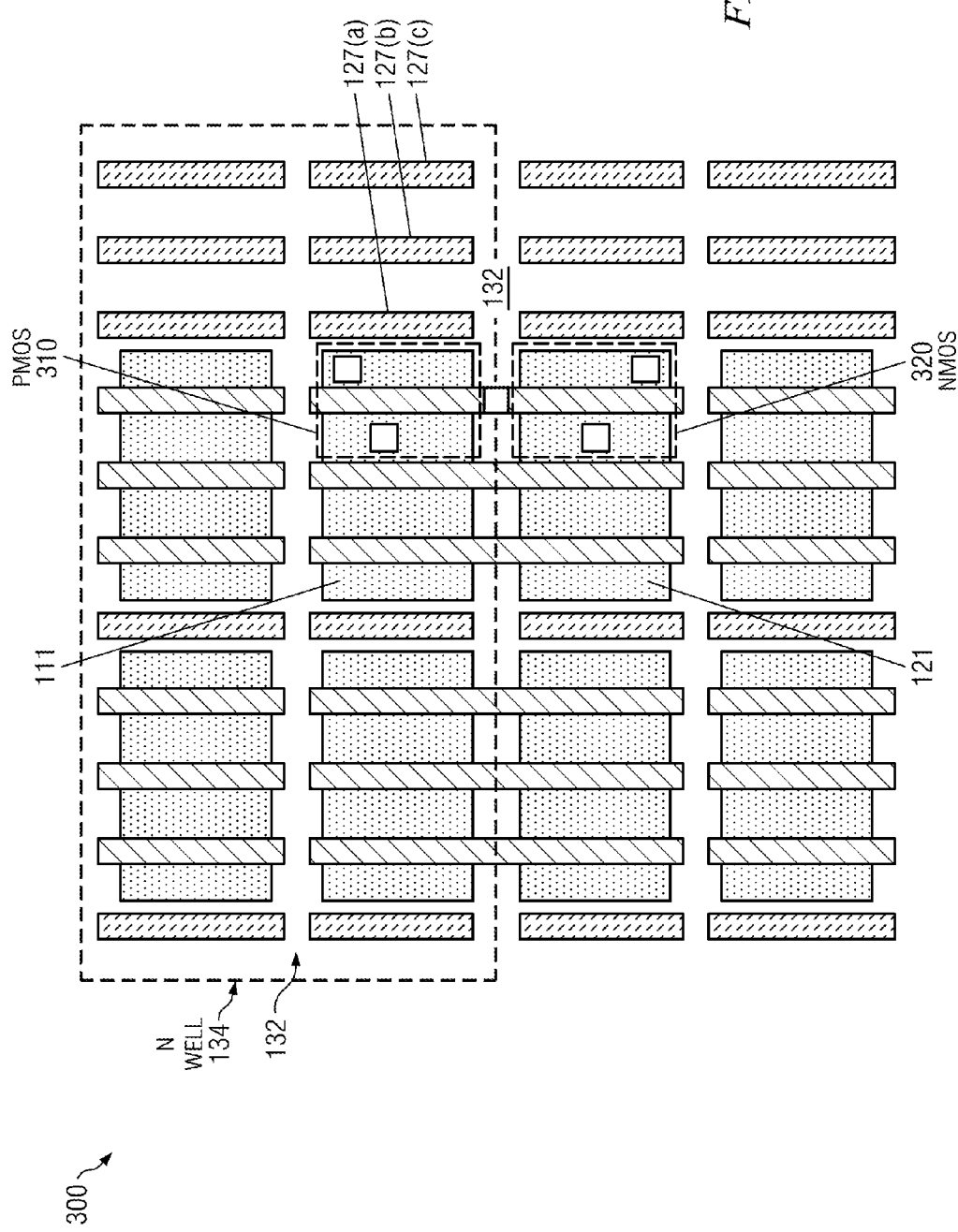
FIG. 3 shows an example variant layout providing context variation for multiple context dependent effects including the number of dummy field assist gates (e.g., polysilicon gate) effect and the active proximity effect (APE), according to a disclosed embodiment.

FIG. 3 shows an example embodiment of a variant layout 300 providing context variation for multiple context dependent effect parameters including the number of dummy field assist gates (e.g., polysilicon gates) effect and the active proximity effect (APE). Layout 300 provides dummy field assist gate effect variation by including three dummy field polysilicon assist gates 127(a), (b) and (c) adjacent to both active variant pMOS transistor 310 and active variant nMOS transistor 320. Layout 300 can be compared to reference layout 100 that has a single dummy field assist gate (e.g., polysilicon gate) 127 for each of active reference pMOS transistor 110 and active reference nMOS transistor 120 as shown in FIG. 1. APE variation is provided because the active area regions to the right of active areas for active reference pMOS transistor 110 and active reference nMOS transistor 120 in FIG. 1 are not included in layout 300. By being a multiple context dependent effect structure, layout 300 can be used to test whether or not "multiple effects" add up to the sum of the individual effects which can be tested in other structures.

Figure 4:
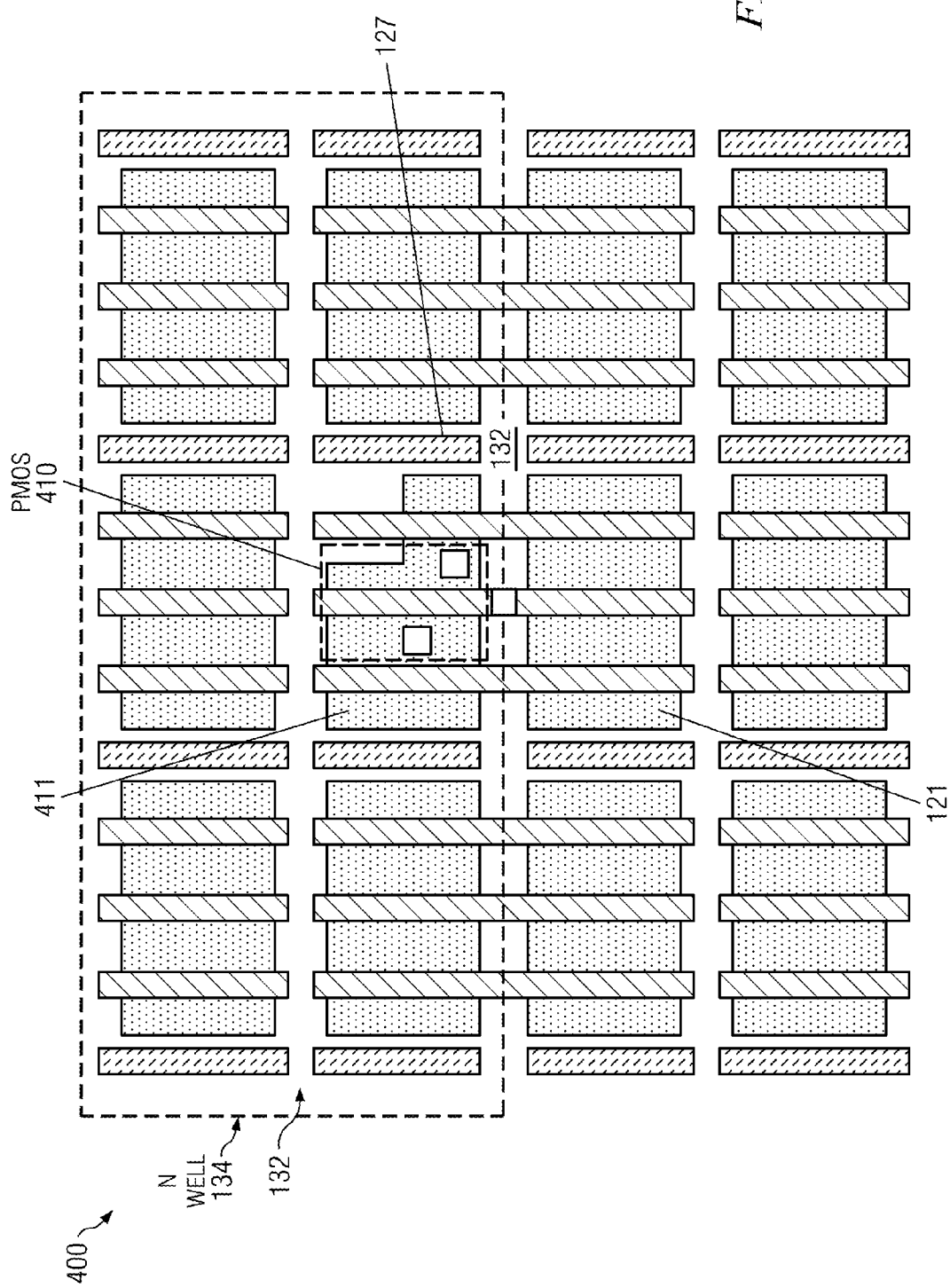
FIG. 4 shows an example variant layout providing context variation for another context dependent effect parameter shown as the active jog effect, according to a disclosed embodiment.

FIG. 4 shows an example embodiment of a variant layout 400 providing context variation for another context dependent effect parameter shown as the active jog effect. Layout 400 includes a single active transistor comprising active variant pMOS transistor 410 defined in an active area 411 that has the same rectangular shape as active area 111 for active reference pMOS transistor 110 shown in FIG. 1, except for an upper right corner cutout portion.

Figure 5:
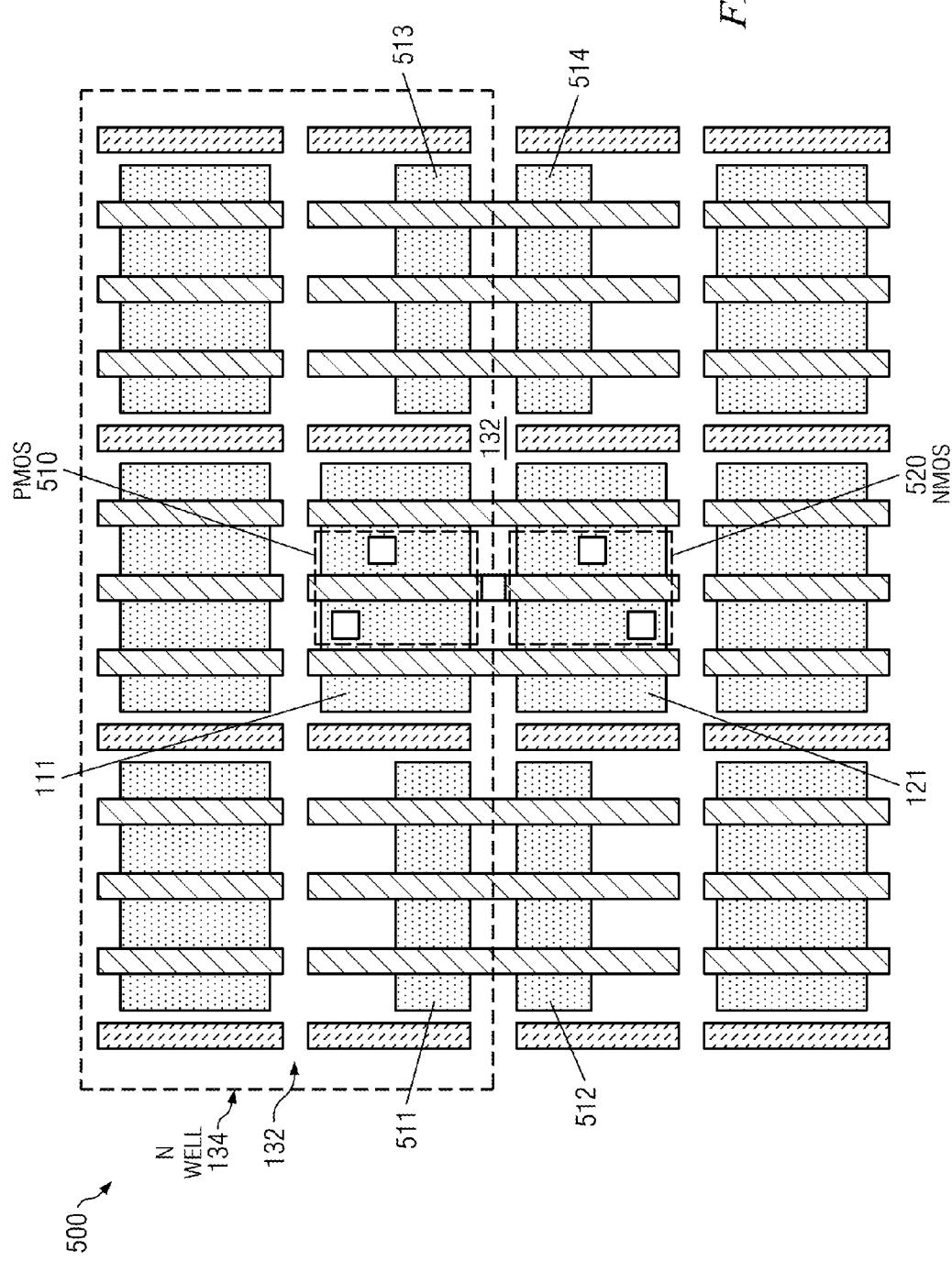
FIG. 5 shows an example variant layout providing context variation for the width of adjacent active effect, according to a disclosed embodiment.

FIG. 5 shows an example embodiment of a variant layout 500 providing context variation for another context dependent effect parameter shown as the width of adjacent active area effect. The width of adjacent active area effect is another example of an active proximity effect (APE). Layout 500 includes n-type active areas 511 and 513 on opposing sides of n-type active area 111 in which active variant pMOS transistor 510 is positioned, and p-type active areas 512 and 514 on opposing sides of the p-type active area in which active variant nMOS transistor 520 is positioned. Layout 500 can be compared to reference layout 100 shown in FIG. 1 in which the adjacent active areas to active reference pMOS transistor 110 and active reference nMOS transistor 120 have the same geometry and width as the other active areas in the layout.

The specific context dependent effects described above are only a few examples of the many context dependent effects that may exist, and generally any context dependent effect may be provided in disclosed on-die parametric test modules. For example, other context dependent effects can include additional APEs including active area-to-active area spacing and missing or present neighboring active area. As described above, a set of test structure layouts included in disclosed on-die parametric test modules placed on production IC die can be used to measure and monitor the most significant context effects in the IC layouts. These test structures can be used in production on production wafers to monitor the process, correlate to chip performance and debug functional fails. They can also be used to gather large volumes of data for the context effects, improving the accuracy of the characterization and modeling.

Figure 6A:
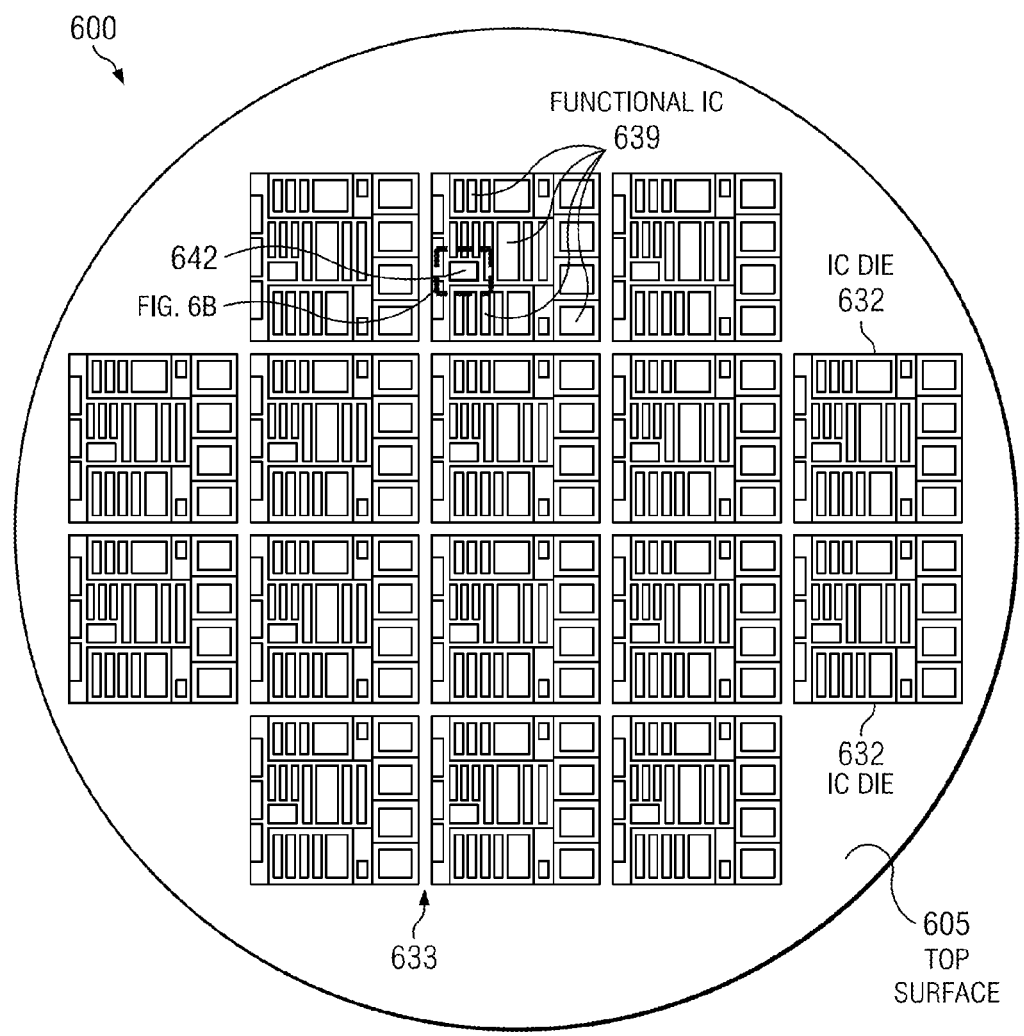
FIG. 6A is an example apparatus shown as a production semiconductor wafer comprising a plurality of IC die areas each having a functional IC portion and an on-die parametric test module portion disclosed herein for in-line monitoring of a plurality of context dependent effects, according to a disclosed embodiment.

FIG. 6A depicts an example embodiment of a production semiconductor wafer 600 comprising a plurality of IC die each having a functional IC and an on-die parametric test module as disclosed herein for in-line monitoring of a plurality of context dependent effects. Semiconductor wafer 600 comprises a top semiconductor surface 605 comprising a plurality of IC die areas 632 separated by scribe line areas 633, each die area defining a die having one or more on-die parametric test modules 642 for in-line monitoring of a plurality of context dependent effects. Although the illustrated on-die parametric test module 642 is shown positioned along an edge of the IC die area 632, on-die parametric test module 642 can be placed in the interior of the IC die area 632, or at one of its corners.

Semiconductor wafer 600 includes a plurality of copies of a functional IC 639 comprising a plurality of circuit elements formed on the top semiconductor surface 605 configured for performing a circuit function on an IC portion of the IC die area 632 not occupied by on-die parametric test module 642. The on-die parametric test module 642 is thus included on the die as part of the fabrication process by the factory. On-die parametric test module 642 does not interfere with the operation of the functional IC 639 and thus may be placed as shown on IC die 632 adjacent to functional IC 639 without affecting its performance.

Figure 6B:
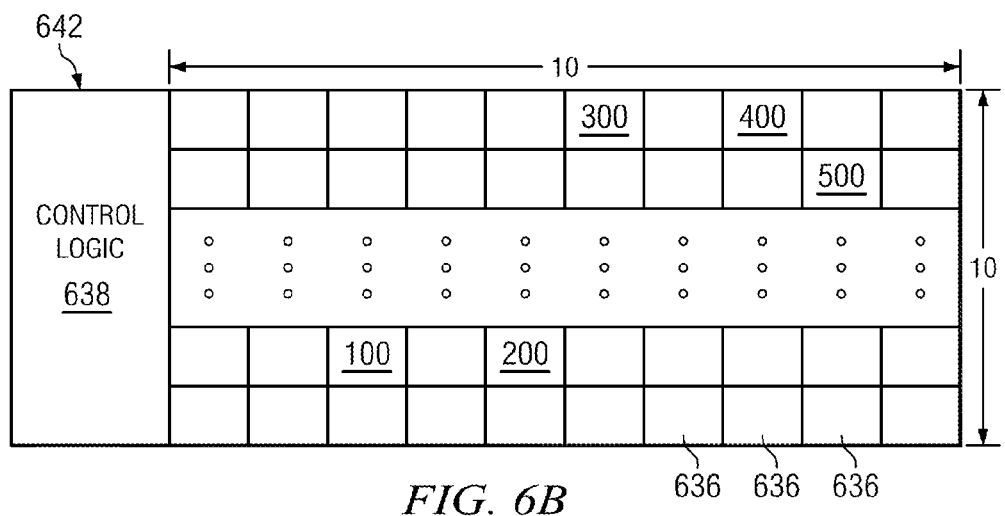
FIG. 6B is an expanded block form example showing details for the on-die parametric test modules shown in FIG. 6A, according to a disclosed embodiment.

FIG. 6B is an expanded block form example showing details for the on-die parametric test modules 642 shown in FIG. 6A. The illustrated on-die parametric test module 642 comprises 100 (10×10) different layouts 636 including at least one reference layout, shown as reference layout 100, and a plurality of different variant layouts including variant layouts 200, 300, 400 and 500 described above.

The shown layouts 636 are controlled by control logic 638. Control logic 638 is used in conjunction with metal interconnects to implement local pin sharing for at least two, up to a maximum number set by the total number of terminals, of the devices to be tested in the on-die parametric test module. For example, for three terminal devices, such as bipolar transistors, locally shared pins can be coupled to at least two of the base, emitter and collector terminals; and for testing MOS transistors locally shared pins can be coupled to at least two of the gate, source, drain, body, and substrate terminals.

The control logic 638 includes a logic controller having a decoder for activating the active structures in one or more layouts 636, and a decode level translator which provides a required logic level or required voltage to one or more structures in layouts 636. The plurality of on-die parametric test modules 642 are each tested with a probe system including a probe card to obtain electrical test measurement data from each of the on-die parametric test modules 642 that includes electrical measurement data from the active reference MOS transistor and electrical measurement data from the plurality of active variant MOS transistors, such as linear current, saturation current, and Vt. The electrical test measurement data is processed to generate measures for the plurality of context dependent effect parameters from each of the plurality of on-die parametric test modules 642. For example, in a typical case over sixty data points are gathered and then the data is filtered to remove outliers, after which systematic variation such as die-to-die variation is removed. Finally the median of the remaining data is taken. An average process with typically more than forty data points should usually be sufficient to ensure that random variation is effectively removed.

The method can include comparing the generated measures such as the drive current and Vt for a plurality of context dependent effect parameters to a predetermined range, and generating an alarm if at least one of the generated measurements has shifted outside of its respective predetermined ranges. The predetermined measurement ranges can be set by an integrated circuit simulation model (e.g., SPICE), and the generated measurements for each of the plurality of context dependent effect parameters for the active reference MOS transistor(s) can be set to zero. The method can include utilizing the generated measures for the plurality of context dependent effect parameters to modify as a function of extracted parameters the values of physics-based parameters in transistor models such as the Berkeley Short-channel IGFET Model (BSIM), and software for an IC simulation model (e.g., SPICE).

Disclosed on-die parametric test modules can be designed to monitor as many context dependent effects as possible given the area allocated on the production IC die to find out whether they stay in the same range as modeled. If the related parameters are found to shift too much (e.g., outside the pre-determined range or some predetermined limit) over time (due to process variations over time) or split (e.g., process splits to improve or optimize transistor performance), then an alarm can be raised (e.g. to product or process engineers) that one or more context dependent effects have shifted, thereby enabling corrective action to be implemented.

Disclosed embodiments also include using context dependent effect parameter data to increase product yield. Such on-die parametric test modules can be used in production on production wafers to monitor the process, correlate to chip performance, and debug functional fails even after singulation. They can also be used to gather large volumes of data for the context dependent effects, such as for improving the accuracy of the characterization and modeling.

For example, data obtained from disclosed on-die parametric test modules can provide information to allow extracting the percent impact of context dependent effects separately from the other sources of variation (spatial and random) found in the process. Moreover, measurement data can be used to identify layout styles that are causing the transistor performance to drift out of the expected performance metric. Such measurement data can also be used to check what process metrics, such as DSL thickness, well doping, etc. need to be adjusted to increase yield.

In an example implementation, the most significant context dependent effects were identified by the Inventors by creating hundreds of different layouts configured to capture most of the variations available within the design rules. These layouts were measured and the most significant context dependent effects were identified. The significance of a given context effect was based on its impact on the drive current. Context effects having at least a 3% impact on the drive current relative to a zero context (reference) layout were included and all context effects fitting criteria were ranked relative to their drive current impact. In addition, several context effects with smaller impact on drive current were included in order to quantify their variation in manufacturing.

For example, some of the on-die parametric test modules captured the impact of the well proximity effect (WPE). If it is shown that the WPE effect is too strong and is reducing yield, it is possible that the ion implant dose, angle, etc. can be adjusted to reduce this effect. Moreover, additional modules that more carefully evaluate the WPE can be evaluated to ascertain that the effect has been sufficiently reduced. These measurements may then be compared to the acceptance criteria and the semiconductor chip/wafer can then be validated.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes. Embodiments may include functional IC and on-die parametric modules that both comprise standard cell-based layouts; the reference layout and at least a portion of the variant layouts may each include no more than two active MOS transistors; and at least one variant layout may provide an active variant MOS transistor that provides a variation with respect to the reference spacing value for exclusively one of the context dependent effect parameters.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An integrated circuit (IC) die, comprising:
   a substrate having a semiconductor surface defining a die area;
   a functional IC formed on an IC portion of said die area comprising a plurality of circuit elements configured for performing a circuit function; and
   an on-die parametric test module formed on a test module portion of said die area different from said IC portion, said on-die parametric test module comprising:
   a reference layout that includes at least one active reference MOS transistor, said active reference MOS transistor having a reference spacing value for each of a plurality of context dependent effect parameters, and
   a plurality of variant layouts, each of said variant layouts providing at least one active variant MOS transistor that provides a variation with respect to said reference spacing value for a different at least one of said context dependent effect parameters.

2. The IC die of claim 1, wherein said plurality of variant layouts includes at least one variant layout formed with at least one active variant MOS transistor that provides a variation with respect to said reference spacing values for two or more of said plurality of context dependent effect parameters.

3. The IC die of claim 2, wherein said plurality of said context dependent effect parameters includes two or more of a length-of gate oxide definition (LOD) effect, an active proximity effect (APE), a well proximity effect (WPE), a number of dummy field assist gates effect, and a dual stress liner (DSL) boundary effect.

4. The IC die of claim 1, wherein said functional IC and said on-die parametric test module both comprise standard cell-based layouts.

5. The IC die of claim 1, wherein said reference layout and at least a portion of said variant layouts each include no more than two active MOS transistors.

6. The IC die of claim 1, wherein said plurality of variant layouts includes at least one variant layout that provides an active variant MOS transistor that provides a variation with respect to said reference spacing value for two or more of said context dependent effect parameters, and at least one variant layout that provides an active variant MOS transistor that provides a variation with respect to said reference spacing value for exclusively one of said context dependent effect parameters.

7. A semiconductor wafer, comprising:
   a substrate having a semiconductor surface defining a plurality of die areas;
   a functional integrated circuit (IC) formed on an IC portion of each said die area, said functional IC comprising a plurality of circuit elements configured for performing a circuit function; and
   an on-die parametric test module formed on a test module portion of each said die area different from said IC portion, said on-die parametric test module comprising:
   a reference layout that includes at least one active reference MOS transistor, said active reference MOS transistor having a reference spacing value for each of a plurality of context dependent effect parameters, and
   a plurality of variant layouts, each variant layout providing at least one active variant MOS transistor that provides a variation with respect to said reference spacing value for a different at least one of said context dependent effect parameters.

8. A method of generating in-line data for monitoring context dependent effect parameters for MOS devices, comprising:
   providing a substrate having a semiconductor surface defining a plurality of die areas, a functional integrated circuit (IC) formed on an IC portion of each said die area including circuit elements for performing a circuit function, and an on-die parametric test module formed on a test module portion of each said die area different from said IC portion; wherein said on-die parametric test module comprises a reference layout that includes at least one active reference MOS transistor, said active reference MOS transistor having a reference spacing value for each of a plurality of context dependent effect parameters, and a plurality of variant layouts, each variant layout providing at least one active variant MOS transistor that provides a variation with respect to said reference spacing value for a different at least one of said context dependent effect parameters;
   testing a plurality of said on-die parametric test modules to obtain electrical test measurement data from each of said on-die parametric test modules comprising measurement data from a respective said active reference MOS transistor and measurement data from respective ones of said active variant MOS transistors; and
   processing said electrical test measurement data to generate measurements for said plurality of said context dependent effect parameters.

9. The method of claim 8, further comprising comparing said generated measurements for said plurality of said context dependent effect parameters to a predetermined range, and generating an alarm signal if at least one of said generated measurements is outside said predetermined range.

10. The method of claim 9, wherein said predetermined range is set by an integrated circuit simulation model, and said generated measurements for each parameter of said plurality of context dependent effect parameters for said active reference MOS transistor are set to zero.

11. The method of claim 9, further comprising utilizing said generated measurements for said plurality of said context dependent effect parameters to modify software for an integrated circuit simulation model.

12. The method of claim 8, wherein said plurality of said context dependent effect parameters includes two or more of a length-of-gate oxide definition (LOD) effect, an active proximity effect (APE), a well proximity effect (WPE), a number of dummy field assist gates effect, and a dual stress liner (DSL) boundary effect.

13. The method of claim 8, wherein said functional IC and said on-die parametric test module both comprise standard cell-based layouts.

14. The method of claim 8, wherein said reference layout and at least a portion of said plurality of variant layouts include no more than two of said active MOS transistors.

15. The method of claim 8, wherein said plurality of variant layouts includes at least one variant layout that provides an active variant MOS transistor that provides a variation with respect to said reference spacing value for a plurality of said context dependent effect parameters, and at least one variant layout that provides an active variant MOS transistor that provides a variation with respect to said reference spacing value for exclusively one of said plurality of context dependent effect parameters.

16. The method of claim 8, wherein said testing comprises wafer level testing.

* * * * *